(12) United States Patent
Yamashita

(10) Patent No.: US 8,441,564 B2
(45) Date of Patent: May 14, 2013

(54) SOLID-STATE IMAGING APPARATUS

(75) Inventor: Yuichiro Yamashita, Ebina (JP)

(73) Assignee: Canon Kabushiki Kaisha, Tokyo (JP)

( * ) Notice: Subject to any disclaimer, the term of this patent is extended or adjusted under 35 U.S.C. 154(b) by 318 days.

(21) Appl. No.: 12/921,232

(22) PCT Filed: Apr. 23, 2009

(86) PCT No.: PCT/JP2009/058531
§ 371 (c)(1),
(2), (4) Date: Sep. 7, 2010

(87) PCT Pub. No.: WO2009/133944
PCT Pub. Date: Nov. 5, 2009

(65) Prior Publication Data
US 2011/0013062 A1 Jan. 20, 2011

(30) Foreign Application Priority Data
May 1, 2008 (JP) .................. 2008-119737

(51) Int. Cl.
*H04N 5/217* (2011.01)
*H04N 3/14* (2006.01)
*H04N 5/335* (2011.01)
*H01L 27/00* (2006.01)
*H01L 31/062* (2012.01)
*H01L 31/113* (2006.01)

(52) U.S. Cl.
USPC ......... 348/299; 348/241; 250/208.1; 257/294

(58) Field of Classification Search .......... 348/241, 348/243, 294, 299; 250/208.1; 257/291–292, 257/294
See application file for complete search history.

(56) References Cited

U.S. PATENT DOCUMENTS

| | | | | |
|---|---|---|---|---|
| 7,420,235 B2* | 9/2008 | Saito | ................ | 257/293 |
| 7,446,356 B2* | 11/2008 | Misawa | ................ | 257/291 |
| 7,488,997 B2 | 2/2009 | Kuwazawa | ................ | 257/233 |
| 7,623,056 B2 | 11/2009 | Yamashita | ................ | 341/163 |

(Continued)

FOREIGN PATENT DOCUMENTS

| EP | 0 809 303 A1 | 11/1997 |
|---|---|---|
| EP | 1 727 205 A2 | 11/2006 |

(Continued)

OTHER PUBLICATIONS

Machine Translation of JP 2004-335882 published Nov. 25, 2004.*

(Continued)

*Primary Examiner* — Daniel M Pasiewicz
(74) *Attorney, Agent, or Firm* — Fitzpatrick, Cella, Harper & Scinto

(57) ABSTRACT

In the solid-state imaging apparatus, the carrier holding portion is arranged at a position in a first direction from a photoelectric conversion portion, a floating diffusion region is arranged at a position in a second direction perpendicular to the first direction from the carrier holding portion with a transfer portion sandwiched between the floating diffusion region and the carrier holding portion, the carrier holding portion included in the first pixel is arranged between the photoelectric conversion portion included in the first pixel and the photoelectric conversion portion included in the second pixel, the carrier holding portion included in the first pixel is covered with a light shielding portion, and the light shielding portion extends over a part of each of the photoelectric conversion portions included in the first and second pixels.

8 Claims, 3 Drawing Sheets

U.S. PATENT DOCUMENTS

| | | | |
|---|---|---|---|
| 7,633,539 B2 | 12/2009 | Yamashita | 348/294 |
| 7,804,534 B2 * | 9/2010 | Nagase et al. | 348/249 |
| 7,817,199 B2 | 10/2010 | Yamashita et al. | 348/308 |
| 8,017,984 B2 * | 9/2011 | Kitano et al. | 257/294 |
| 2005/0110093 A1 | 5/2005 | Altice, Jr. et al. | 257/359 |
| 2006/0028567 A1 | 2/2006 | Kuwazawa | 348/294 |
| 2007/0278535 A1 * | 12/2007 | Watanabe et al. | 257/233 |
| 2009/0086063 A1 | 4/2009 | Suzuki et al. | 348/241 |
| 2009/0244328 A1 | 10/2009 | Yamashita | 348/241 |
| 2009/0251578 A1 | 10/2009 | Yamashita | 348/302 |
| 2009/0256176 A1 | 10/2009 | Kobayashi et al. | 257/225 |
| 2009/0284632 A1 | 11/2009 | Onuki et al. | 348/302 |
| 2010/0053398 A1 | 3/2010 | Yamashita | 348/302 |
| 2010/0165167 A1 | 7/2010 | Sugiyama et al. | 348/311 |
| 2010/0200738 A1 | 8/2010 | Yamashita | 250/227.11 |

FOREIGN PATENT DOCUMENTS

| | | |
|---|---|---|
| JP | 2004-335882 A | 11/2004 |
| JP | 2006-049743 A | 2/2006 |
| JP | 2006-246450 A | 9/2006 |
| WO | WO 2007/142171 A1 | 12/2007 |

OTHER PUBLICATIONS

Office Action in Chinese Appln. No. 200980115035.7 dated Jun. 1, 2012.

* cited by examiner

SOLID-STATE IMAGING APPARATUS

TECHNICAL FIELD

The present invention relates to an element layout of a solid-state imaging apparatus having pixels each including a carrier holding portion that accumulates a signal carrier generated by a photoelectric conversion portion.

BACKGROUND ART

A known configuration of solid-state imaging apparatuses has pixels arranged two dimensionally. Among such solid-state imaging apparatuses, configurations having electronic shutter functions have been known in order to start and finish accumulating signal carriers in all pixels at the same time. The configurations are exemplified in Japanese Patent Application Laid-Open No. 2006-246450 (hereinafter referred to as Patent Document 1) and Japanese Patent Application Laid-Open No. 2006-049743 (hereinafter referred to as Patent Document 2), for example.

For the electronic shutter functions, there are provided, separately from photoelectric conversion portions that perform photoelectrical conversion, carrier holding portions that hold the photoelectrically converted carriers for predetermined time periods.

In the configurations discussed in Patent Document 1 and Patent Document 2, sufficient considerations have not been given in terms of optimizing potential structures within semiconductor substrates by layouts of elements within pixels and disposing light shielding portions for inhibiting light from being incident on carrier holding portions.

The present invention is directed to optimizing a potential structure on a semiconductor substrate in a solid-state imaging apparatus having pixels each including a carrier holding portion, for example, by suitably arranging elements constituting the pixel.

DISCLOSURE OF THE INVENTION

In view of the foregoing problems, a solid-state imaging apparatus according to the present invention includes a plurality of pixels arranged two dimensionally, in which each of the pixels includes a photoelectric conversion portion generating signal carriers, a carrier holding portion capable of holding the signal carriers having a semiconductor region of a first conductivity type capable of accumulating the signal carrier and a control electrode arranged over the semiconductor region sandwiching an insulating film between the semiconductor region and the control electrode, a floating diffusion region of a first conductivity type, and a transfer portion for controlling an electrical connection between the semiconductor region of the first conductivity type and the floating diffusion region, in which within the same pixel, the semiconductor region of the first conductivity type is arranged at a position in a first direction from the photoelectric conversion portion, the floating diffusion region is arranged at a position in a second direction perpendicular to the first direction from the semiconductor region of the first conductivity type sandwiching the transfer portion between the floating diffusion region and the semiconductor region of the first conductivity type, the plurality of pixels include a first pixel and a second pixel arranged adjacent to the first pixel in the first direction, the semiconductor region of the first conductivity type included in the first pixel is arranged between the photoelectric conversion portions included in the first and second pixels, the carrier holding portion included in the first pixel is covered with a light shielding portion, and the light shielding portion extends over a part of each of photoelectric conversion portions of the first and second pixels.

Other features and advantages of the present invention will be apparent from the following description taken in conjunction with the accompanying drawings, in which like reference characters designate the same or similar parts throughout the figures thereof.

The accompanying drawings, which are incorporated in and constitute a part of the specification, illustrate embodiments of the invention and, together with the description, serve to explain the principles of the invention.

BEST MODE FOR CARRYING OUT THE INVENTION (First Embodiment)

Figure 1:
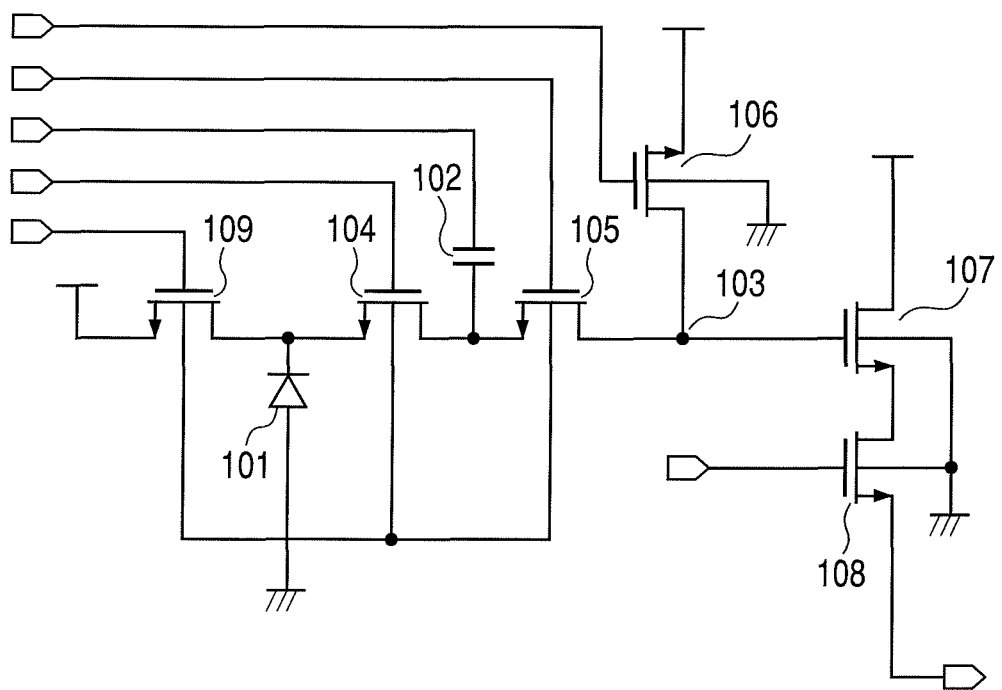
FIG. 1 is a diagram for describing an example of a circuit diagram of a solid-state imaging apparatus.

FIG. 1 is an example of a diagram of a pixel circuit in a solid-state imaging apparatus according to the present embodiment.

A photoelectric conversion portion 101 is a photodiode in this example. A carrier holding portion 102 can hold a signal carrier generated by the photoelectric conversion portion. A carrier-to-voltage conversion portion 103 converts the signal carrier into a voltage. A first transfer portion 104 controls transfer of the carrier from the photoelectric conversion portion to the carrier holding portion. The first transfer portion 104 is a MOS transistor in this example. The first transfer portion controls a potential as to the signal carrier at a signal carrier path between the photoelectric conversion portion and the carrier holding portion. In one configurations of the first transfer portion, a control electrode may be provided to actively control a potential state to control signal carrier conduction. In another configuration of the first transfer portion, a signal carrier path may be in a buried channel structure with a potential gradient so that a signal carrier moves from a photoelectric conversion portion to a carrier holding portion during a light exposing period. In the latter case, a control gate in the carrier holding portion (described later) can also be extended to a buried channel portion so that the same bias as that applied to the carrier holding portion can be applied to the buried channel portion.

A second transfer portion 105 controls an electrical connection between the carrier holding portion and the carrier-to-voltage conversion portion. The second transfer portion 105 can transfer the signal carrier from the carrier holding portion 102 to the carrier-to-voltage conversion portion 103. The second transfer portion 105 is a MOS transistor in this example. A reset portion 106 resets the carrier-to-voltage conversion portion. The reset portion 106 is a MOS transistor in this example.

An amplifying transistor 107 is a MOS transistor in this example. The MOS transistor has its gate electrically connected to the carrier-to-voltage conversion portion 103. The signal that has been converted into the voltage by the carrier-to-voltage conversion portion is amplified and is output outward. For example, the amplifying transistor 107, together with a constant current source (not shown), constitutes a source follower circuit.

A selection portion 108 selects pixels arranged two dimensionally for each pixel row. The selection portion 108 is a MOS transistor in this example. A carrier discharge control portion 109 can discharge the carrier generated by the photoelectric conversion portion outward. In this example, the carrier discharge control portion 109 is an overflow drain MOS transistor having a photoelectric conversion portion as its source. The carrier discharge control portion 109 has a semiconductor region identical in polarity to the signal carrier generated by the photoelectric conversion portion as its source and has a semiconductor region supplied with a power supply voltage as its drain. The drain serves as a carrier discharge portion.

Although one pixel includes all constructional elements in this example, multiple pixels may share an amplifying portion, a selection portion, and a reset portion.

The operations of the pixel circuit will be then described. First, after a carrier within the photoelectric conversion portion 101 is discharged to the carrier discharge portion through the carrier discharge control portion 109, photoelectric conversion (a light exposing period) is started. When the signal carrier path between the photoelectric conversion portion 101 and the carrier holding portion 102 is in a buried channel structure, a signal carrier generated by the photoelectric conversion quickly moves to the carrier holding portion 102. The signal carrier remaining in the photoelectric conversion portion 101 immediately before the light exposing period is terminated is transferred to the carrier holding portion 102 through the first transfer portion 104.

Then, the signal carrier accumulated in the carrier holding portion 102 is transferred to the carrier-to-voltage conversion portion 103 through the second transfer portion 105 and is converted into a voltage. The voltage is amplified by the amplifying transistor 107 and is sequentially read out by the selection portion 108.

After the light exposing period is terminated, the carrier discharge control portion 109 is allowed to conduct, to make a potential at a carrier path between the photoelectric conversion portion and the carrier discharge portion lower than a potential at the carrier path between the photoelectric conversion portion and the carrier holding portion. The potential here means that for a signal carrier. This enables leakage of the signal carrier from the photoelectric conversion portion 101 to the carrier holding portion 102 to be controlled.

The configuration shown in FIG. 1 enables an operation for resetting the carrier in the photoelectric conversion portion 101, an operation for transferring the signal carrier from the photoelectric conversion portion 101 to the carrier holding portion 102, and an operation for allowing the carrier discharge portion 109 to conduct to be simultaneously performed for all the pixels. These operations achieve a so-called global electronic shutter.

Figure 2:
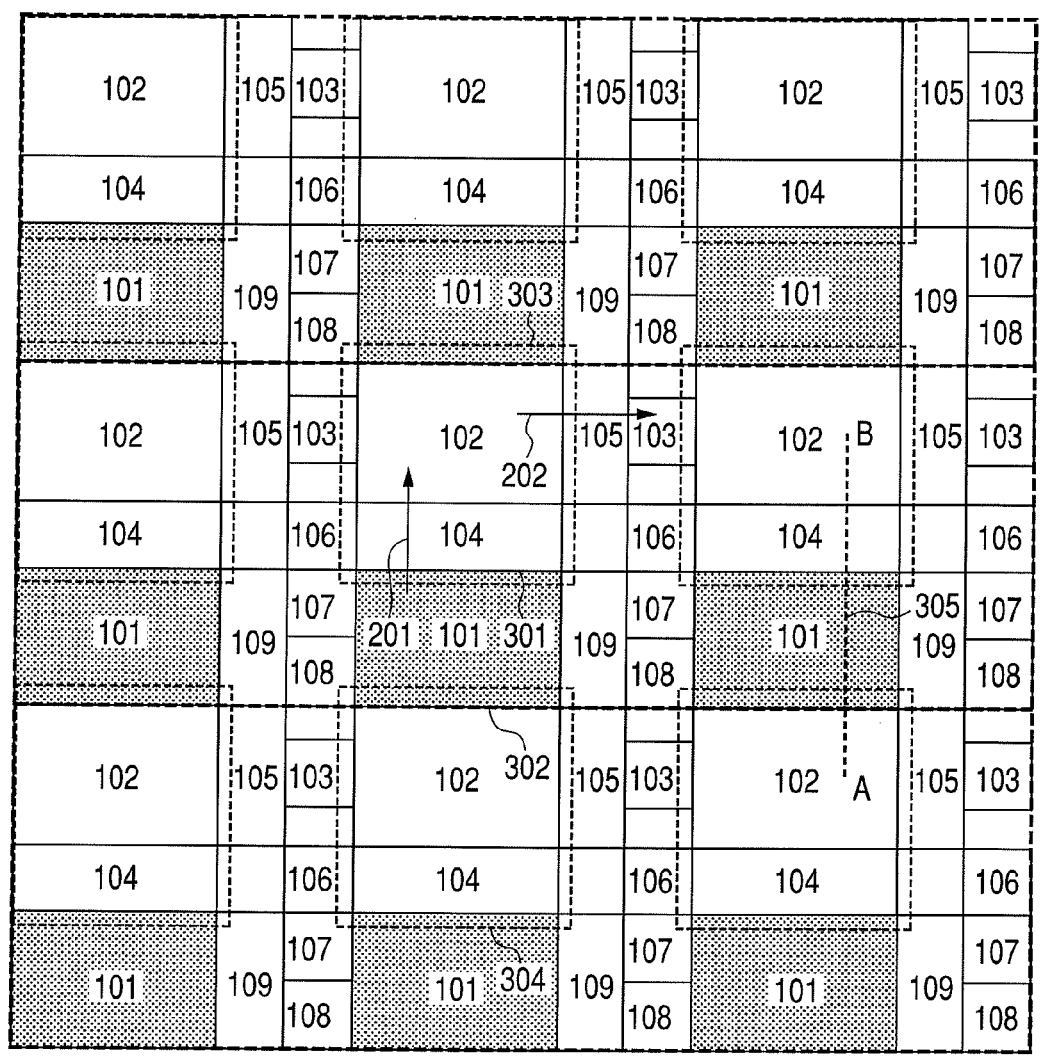
FIG. 2 is a top view of a solid-state imaging apparatus according to a first embodiment.

FIG. 2 is a top view of pixels in the solid-state imaging apparatus according to the present embodiment. Although nine pixels are herein illustrated, more pixels may be arranged. Each pixel includes the constructional elements described in the circuit diagram shown in FIG. 1. Although each of regions is rectangular for purposes of illustration, each of the constructional elements is not rectangular. At least the constructional element is arranged in the region. Portions having the same functions as those shown in FIG. 1 are assigned the same reference numerals and hence, the detailed description thereof is omitted.

In FIG. 2, as a layout of the elements within the same pixel, the carrier holding portion 102 is arranged at a position in a first direction from the photoelectric conversion portion 101, and the carrier-to-voltage conversion portion 103 is arranged at a position in a second direction perpendicular to the first direction from the carrier holding portion 102 with the transfer portion sandwiched therebetween.

Such a configuration enables the carrier-to-voltage conversion portion to be arranged between the carrier holding portions in the adjacent pixels without increasing the distance between the carrier-to-voltage conversion portion and the photoelectric conversion portion. This enables the optimization of the potential structure of the carrier holding portion and the reduction in pixel pitch.

The foregoing will be described in more detail. The carrier-to-voltage conversion portion includes a floating diffusion region (FD region) of a first conductivity type identical in polarity to a signal carrier. The FD region forms PN junction with a semiconductor region of a second conductivity type. The FD region is generally set to a high concentration (for example, an impurity concentration of $1 \times 10^{19}$ to $1 \times 10^{20}$ $cm^{-3}$) and is reverse-biased to a high reset voltage (approximately a power supply voltage) so that a depletion layer greatly extends from the FD region. In such a state, when the FD region is brought closer to the photoelectric conversion portion, an end of the depletion layer extended from the FD region must be separated by a certain amount from the photoelectric conversion portion so that a reduction in the height of a potential barrier for the signal carrier can be restrained. Thus, the photo current from the photoelectric conversion portion to the FD region must be limited to a sufficiently negligible value. In such an element layout in which a photoelectric conversion portion and a carrier-to-voltage conversion portion in adjacent pixels are close to each other, it is difficult to make a pixel pitch fine. Under the condition that a determined number of pixels are arranged in a generally determined area, the elements are arranged so as to make an opening of the photoelectric conversion portion as wide as possible. The width of an element isolation region may also be made as small as possible. Under such circumstances, if the linear arrangement of the photoelectric conversion portion, the carrier holding portion and the carrier-to-voltage conversion portion in the same pixel is repeatedly placed, the carrier-to-voltage conversion portion is arranged close to the photoelectric conversion portion in the adjacent pixel. In this case, the width of the element isolation region may be also expanded. This causes the pixel pitch to be made coarse (not fine), thereby making it difficult to satisfy the conditions such as the number of pixels. On the other hand, according to the present embodiment, an element isolation region having a relatively large width isolates the carrier-to-voltage conversion portion from the photoelectric conversion portion in the peripheral pixel. Furthermore, a MOS transistor or the like constituting the pixel may be arranged therebetween.

Here, the semiconductor region of a first conductivity type constituting the carrier holding portion has an impurity concentration (e.g., approximately $1 \times 10^{17}$ $cm^{-3}$) lower than that of the FD region in terms of its characteristics, and is reverse-biased to a voltage lower than the voltage supplied to the FD region in many cases.

The configuration of the present embodiment enables the distance between the carrier holding portion and the photoelectric conversion portion to be shortened. Therefore, the distance between the carrier holding portion from which a depletion region extends a relatively short length and the photoelectric conversion portion can be shortened. As a result, the pixel pitch can be made fine.

This configuration is effective particularly for the pixel in which the carrier during the photoelectric conversion is transferred to the carrier holding portion and accumulated therein, since the signal carrier requires to be inhibited from moving toward the portions other than the carrier holding portion. The reason for that requirement is that the movement of the signal carrier to the portions other than the carrier holding portion causes the reduction in the sensitivity of the pixel and the variation in the pixel sensitivity depending on the amount of carrier held in the carrier holding portion and the total incident light quantity, resulting in nonlinearity of the sensitivity and a variation in the sensitivity due to the difference in the nonlinearity for each pixel.

Note that a similar problem exists with not only the FD region but also the drain region of the overflow drain MOS transistor 109. That is, the drain region also has a high impurity concentration and is reverse-biased to the vicinity of the power supply voltage so that a depletion layer greatly extends therefrom. Therefore, the photoelectric conversion portion may be arranged so as not to come closer to the drain region.

On the other hand, considering the function of the overflow drain, it may be brought closer to the photoelectric conversion portion. As further measures against that, it is possible to employ a structure for discharging a carrier toward a substrate, which is called a vertical overflow drain, thereby eliminating the need to consider a positional relationship on a plane between the overflow drain and the photoelectric conversion portion, then enabling the pixel pitch to be further made fine.

In the present embodiment, there are provided a first pixel and a second pixel arranged adjacent to the first pixel in a first direction (in an upward direction in FIG. 2), where the pixel arranged in the lowermost part of a central column in FIG. 2 is referred to as a first pixel. The carrier holding portion in the first pixel is arranged between the photoelectric conversion portions in the first and second pixels. The carrier holding portion included in the first pixel is covered with a light shielding portion 304, and the light shielding portion 304 extends over a part of each of the photoelectric conversion portions included in the first and second pixels.

A control electrode in a carrier holding portion may be formed of the same layer as that forming a transfer electrode constituting a first transfer portion in many cases. In this case, the respective thicknesses of the electrodes may be often equal to each other. Furthermore, the transfer electrode constituting the first transfer portion and the control electrode in the carrier holding portion are formed on the same semiconductor substrate. Therefore, the respective thicknesses of the electrodes are also equal to each other. A light shielding portion is deposited and patterned thereon so that optical symmetry in each of photoelectric conversion portions can be enhanced. Specifically, in FIG. 2, the carrier holding portion included in the first pixel is covered with a light shielding portion 303, and the light shielding portion 303 extends over a part of each of the photoelectric conversion portions included in the first and second pixels. Here, "optical symmetry" means that respective optical paths in pixels are translationally symmetric. Although the angles of incident light may differ depending on the position of a pixel region, a light shielding portion is extended over a relatively flat photoelectric conversion portion, thereby making a pattern of the light shielding portion less likely to be affected by the underlying portions.

When the light shielding portion is patterned on an underlying element isolation region, a light shielding pattern may, in some cases, vary in each of pixels because of the influence of the element isolation region irrespective of an attempt to enhance optical symmetry. However, such an influence can be reduced according to the present embodiment.

Figure 3:
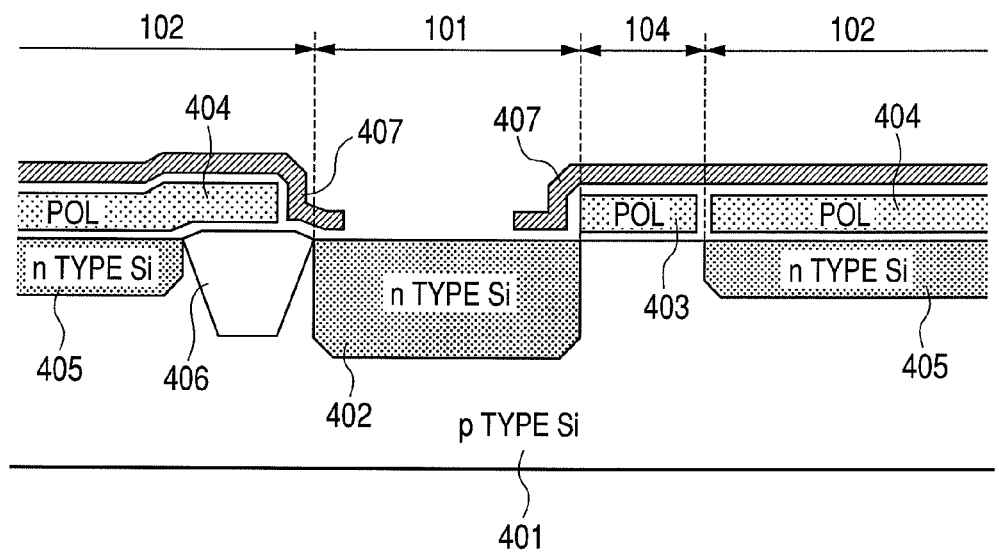
FIG. 3 is a cross-sectional view of the solid-state imaging apparatus according to the first embodiment.

FIG. 3 is a cross-sectional view taken along a dotted line A-B denoted by reference numeral 305 in FIG. 2. Portions having the same functions as those shown in FIG. 2 are assigned the same reference numerals and hence, the detailed description thereof is omitted. A case where electrons are used as a signal carrier will be now described. A case where holes are used as a signal carrier can be derived by reversing the conductivity type of each of semiconductor regions. The above-mentioned first and second conductivity types are respectively taken as an N type and a P type.

A P type semiconductor substrate 401 is provided. Alternatively, a P type semiconductor region arranged on an N type substrate may be provided. An N type semiconductor region 402 constitutes a part of the photoelectric conversion portion. The N type semiconductor region 402 forms PN junction with the P type semiconductor substrate 401, to constitute a part of a photodiode.

A transfer electrode 403 constitutes a part of the first transfer portion 104. A voltage supplied to the transfer electrode 403 controls a potential for a signal carrier at a signal carrier path between the N type semiconductor region 402 and an N type semiconductor region 405, described later.

The N type semiconductor region 405 can accumulate the signal carrier from the photoelectric conversion portion. A control electrode 404 controls a potential on a surface of the N type semiconductor region 405. The control electrode 404 is arranged on the N type semiconductor region 405 with an insulating film sandwiched therebetween. The carrier holding portion 102 includes the control electrode 404 and the N type semiconductor region 405.

An element isolation region 406 isolates the N type semiconductor region 405 in the carrier holding portion in one pixel from the N type semiconductor region 402 in the photoelectric conversion portion in another pixel. Herein illustrated as an example of the element isolation region 406 is an isolation structure in which an insulator such as a silicon oxide is buried in a trench, which is referred to as STI (Shallow Trench Isolation).

A light shielding layer 407 covers the whole of the carrier holding portion 102, and extends over a part of each of the photoelectric conversion portions included in the adjacent first and second pixels. Furthermore, the light shielding layer 407 covers the transfer electrode 403 and the control electrode 404.

Such a configuration enables a clearance formed between a light shielding portion and a semiconductor substrate to be made significantly narrow thereby reducing leakage of light into the clearance.

As described in the foregoing, according to the present embodiment, in the configuration in which the pixel includes the carrier holding portion, the light shielding portion is extended to the photoelectric conversion portion without being patterned on the element isolation region, which allows production of pixels with fine pitches. In addition, the amount of light incident on the carrier holding portion can be reduced.

(Second Embodiment)

Figure 4:
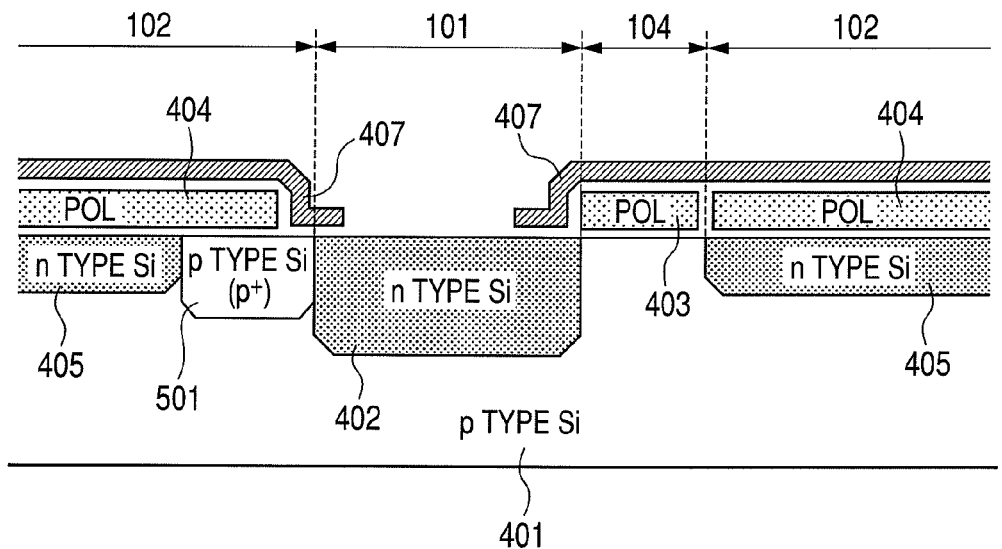
FIG. 4 is a cross-sectional view of a solid-state imaging apparatus according to a second embodiment.

FIG. 4 is a cross-sectional view of a solid-state imaging apparatus according to the present embodiment. An available planar layout is the layout shown in FIG. 2. Portions having the same functions as those shown in FIG. 3 are assigned the same reference numerals and hence, the detailed description thereof is omitted.

In the present embodiment, the element isolation structure between an N type semiconductor region 405 in a carrier holding portion 102 in one pixel and an N type semiconductor region 402 in a photoelectric conversion portion 101 in another pixel is a PN junction isolation using a P type semiconductor region having a higher impurity concentration than that of a P type semiconductor substrate 401.

The element isolation structure using PN junction improves surface flatness more greatly than the structure in which an oxide film or the like is buried. This enables a change in the height of a control electrode 404 in the carrier holding portion to be further restrained, making it easy to form a light shielding portion to be arranged thereabove. Furthermore, in contrast to the case of using isolation structure made of silicon oxide, photoelectrons that have reached a P type semiconductor region in an isolation portion are absorbed upon being coupled to holes acting as a majority carrier after photoelectric conversion before reaching the carrier holding portion. Therefore, the light shielding performance can be further improved.

This application claims the benefit of Japanese Patent Application No. 2008-119737, filed May 1, 2008, which is hereby incorporated by reference herein in its entirety.

The invention claimed is:

1. A solid-state imaging apparatus comprising a plurality of pixels arranged two dimensionally on a semiconductor substrate, wherein each of the pixels includes:
   a photoelectric conversion portion for generating signal carriers;
   a carrier holding portion capable of holding the signal carriers, including a semiconductor region of a first conductivity type capable of accumulating the signal carriers, and a control electrode arranged over the semiconductor region sandwiching an insulating film between the semiconductor region and the control electrode;
   a floating diffusion region of a first conductivity type; and
   a transfer portion for controlling an electrical connection between the semiconductor region of the first conductivity type and the floating diffusion region,
   wherein for each pixel, the semiconductor region of the first conductivity type is arranged at a position in a first direction from the photoelectric conversion portion, and the floating diffusion region is arranged at a position in a second direction perpendicular to the first direction from the semiconductor region of the first conductivity type sandwiching the transferring portion between the floating diffusion region and the semiconductor region of the first conductivity type,
   wherein the plurality of pixels includes a first pixel and a second pixel arranged adjacent to the first pixel in the first direction, the semiconductor region of the first conductivity type included in the first pixel is arranged between the photoelectric conversion portions included in the first and second pixels, the carrier holding portion included in the first pixel is covered with a light shielding portion, and the light shielding portion extends to a part of each of the photoelectric conversion portions in the first and second pixels,
   wherein an element isolation region including an insulator is arranged between the semiconductor region of a first conductivity type in the first pixel and the photoelectric conversion portion of the second pixel, and
   wherein the light shielding portion of the first pixel extends over the element isolation region to an upper part of the photoelectric conversion portion of the second pixel without being patterned on the element isolation region.

2. The solid-state imaging apparatus according to claim 1, wherein the semiconductor region of the first conductivity type has an impurity concentration not larger than an impurity concentration of the floating diffusion region.

3. The solid-state imaging apparatus according to claim 2, wherein the semiconductor region of the first conductivity type and the floating diffusion region form PN junction with a semiconductor region of a second conductivity type, and a width of a depletion layer extending from the semiconductor region of a first conductivity type is not larger than a width of a depletion layer extending from the floating diffusion region.

4. The solid-state imaging apparatus according to claim 1, wherein the element isolation region comprises a PN junction isolation.

5. The solid-state imaging apparatus according to claim 1, wherein each of the pixels includes an amplifying portion, and the floating diffusion region is electrically connected to the amplifying portion.

6. The solid-state imaging apparatus according to claim 1, further comprising a carrier discharging portion for discharging the carrier in the photoelectric conversion portion, such that, during a light exposing period, a potential as to the signal carrier at a path between the photoelectric conversion portion and the carrier holding portion is lower than a potential as to the signal carrier at a path between the photoelectric conversion portion and the carrier discharging port.

7. The solid-state imaging apparatus according to claim 6, wherein the path between the photoelectric conversion portion and the carrier holding portion is in a buried channel structure.

8. A solid-state imaging apparatus comprising a plurality of pixels arranged two dimensionally on a semiconductor substrate, wherein each of the pixels includes:
   a photoelectric conversion portion for generating a signal carrier;
   a carrier holding portion capable of holding the signal carrier, including a semiconductor region of a first conductivity type capable of accumulating the signal carrier, and a control electrode arranged over the semiconductor region sandwiching an insulating film between the semiconductor region and the control electrode;
   a floating diffusion region of a first conductivity type; and
   a transfer portion for controlling an electrical connection between the semiconductor region of the first conductivity type and the floating diffusion region,
   wherein for each pixel, the semiconductor region of the first conductivity type is arranged at apposition in a first direction from the photoelectric conversion portion, and the floating diffusion region is arranged at a position in a second direction perpendicular to the first direction from the semiconductor region of the first conductivity type sandwiching the transferring portion between the floating diffusion region and the semiconductor region of the first conductivity type,
   wherein the plurality of pixels includes a first pixel and a second pixel arranged adjacent to the first pixel in the first direction, the semiconductor region of the first conductivity type included in the first pixel is arranged between the photoelectric conversion portions included in the first and second pixels, the carrier holding portion included in the first pixel is covered with a light shielding portion, and the light shielding portion extends to a part of each of the photoelectric conversion portions of the first and second pixels,
   wherein an element isolation region including an insulator is arranged between the semiconductor region of a first conductivity type in the first pixel and the photoelectric conversion portion of the second pixel,
   wherein the light shielding portion of the first pixel extends over the element isolation region to an upper part of the photoelectric conversion portion of the second pixel without being patterned on the element isolation region, wherein the semiconductor region of the first conductivity type has an impurity concentration not larger than an impurity concentration of the floating diffusion region, the semiconductor region of the first conductivity type and the floating diffusion region form PN junction with a semiconductor region of a second conductivity type, and a width of a depletion layer extending from the semiconductor region of a first conductivity type is not larger than a width of a depletion layer extending from the floating diffusion region, and wherein the path between the photoelectric conversion portion and the carrier holding portion is in a buried channel structure.

* * * * *